United States Patent
Chu et al.

(10) Patent No.: US 11,201,094 B2
(45) Date of Patent: Dec. 14, 2021

(54) FORMING METAL GATES WITH MULTIPLE THRESHOLD VOLTAGES

(71) Applicant: Taiwan Semiconductor Manufacturing Co., Ltd., Hsin-Chu (TW)

(72) Inventors: Lung-Kun Chu, New Taipei (TW); Mao-Lin Huang, Hsinchu (TW); Wei-Hao Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/372,021

(22) Filed: Apr. 1, 2019

(65) Prior Publication Data
US 2020/0058558 A1    Feb. 20, 2020

Related U.S. Application Data

(60) Provisional application No. 62/764,876, filed on Aug. 15, 2018.

(51) Int. Cl.
| | |
|---|---|
| *H01L 21/8238* | (2006.01) |
| *H01L 21/02* | (2006.01) |
| *H01L 27/088* | (2006.01) |
| *H01L 21/3115* | (2006.01) |
| *H01L 27/092* | (2006.01) |
| *H01L 21/8234* | (2006.01) |

(52) U.S. Cl.
CPC .......... *H01L 21/823857* (2013.01); *H01L 21/02329* (2013.01); *H01L 21/31155* (2013.01); *H01L 21/823821* (2013.01); *H01L 27/0886* (2013.01); *H01L 27/0922* (2013.01); *H01L 27/0924* (2013.01); *H01L 21/823431* (2013.01); *H01L 21/823462* (2013.01)

(58) Field of Classification Search
CPC ......... H01L 29/7855; H01L 21/823462; H01L 21/823431; H01L 21/823857; H01L 21/823821; H01L 27/0886; H01L 21/02329; H01L 21/31155

See application file for complete search history.

(56) References Cited

U.S. PATENT DOCUMENTS

| | | | | |
|---|---|---|---|---|
| 9,484,427 | B2 * | 11/2016 | Ando | H01L 29/4966 |
| 9,640,443 | B2 * | 5/2017 | Kim | H01L 27/1104 |
| 2015/0035084 | A1 * | 2/2015 | Li | H01L 29/513 |
| | | | | 257/410 |

* cited by examiner

*Primary Examiner* — Phat X Cao
*Assistant Examiner* — Diana C Vieira
(74) *Attorney, Agent, or Firm* — Haynes and Boone, LLP

(57) ABSTRACT

A method of fabricating an integrated circuit (IC) structure, includes forming a gate trench that exposes a portion of each of a plurality of fins and forming a threshold voltage (Vt) tuning dielectric layer in the gate trench over the plurality of fins. Properties of the Vt tuning dielectric layer are adjusted during the forming to achieve a different Vt for each of the plurality of fins. The method also includes forming a glue metal layer over the Vt tuning dielectric layer; and forming a fill metal layer over the glue metal layer. The fill metal layer has a substantially uniform thickness over top surfaces of the plurality of fins.

20 Claims, 17 Drawing Sheets

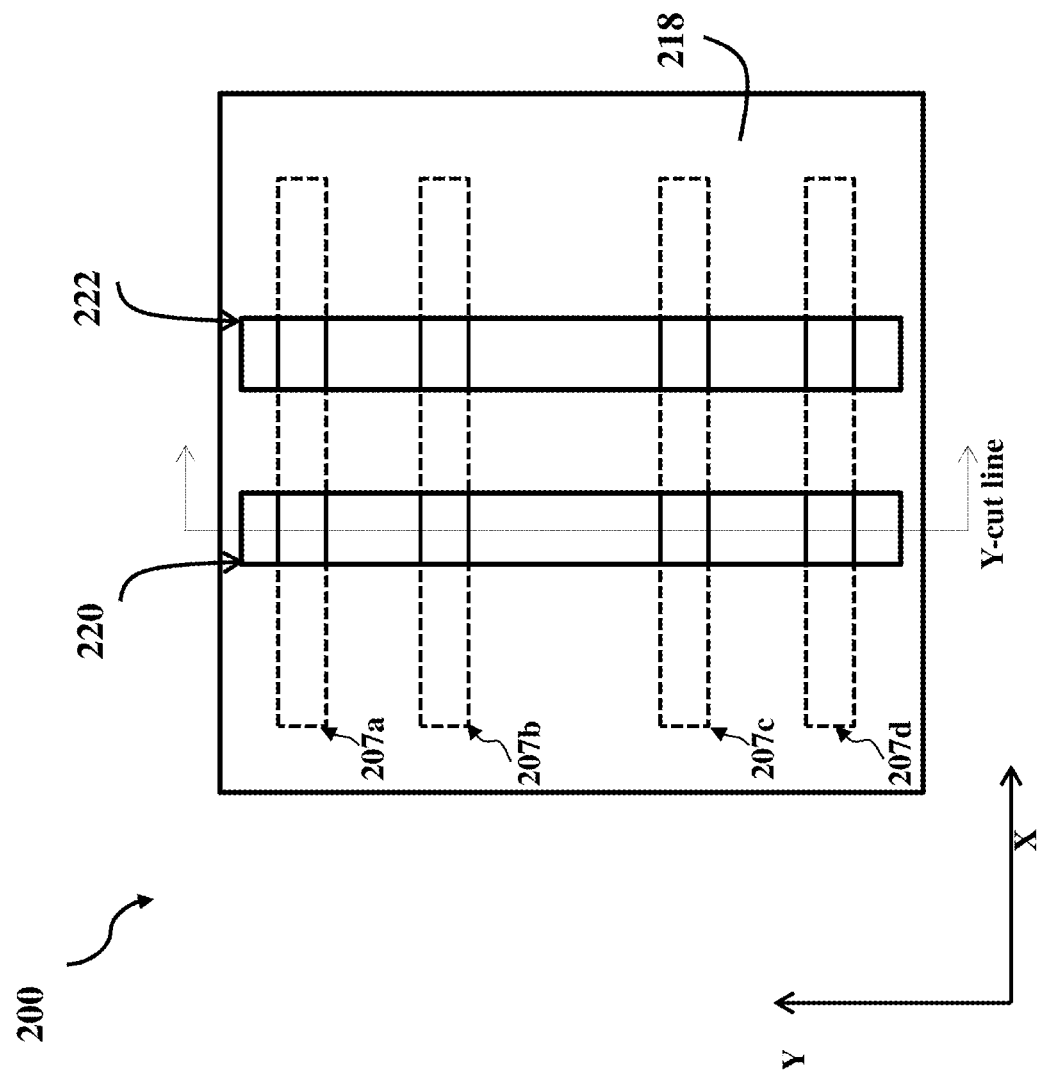
FIG. 2A (top view)

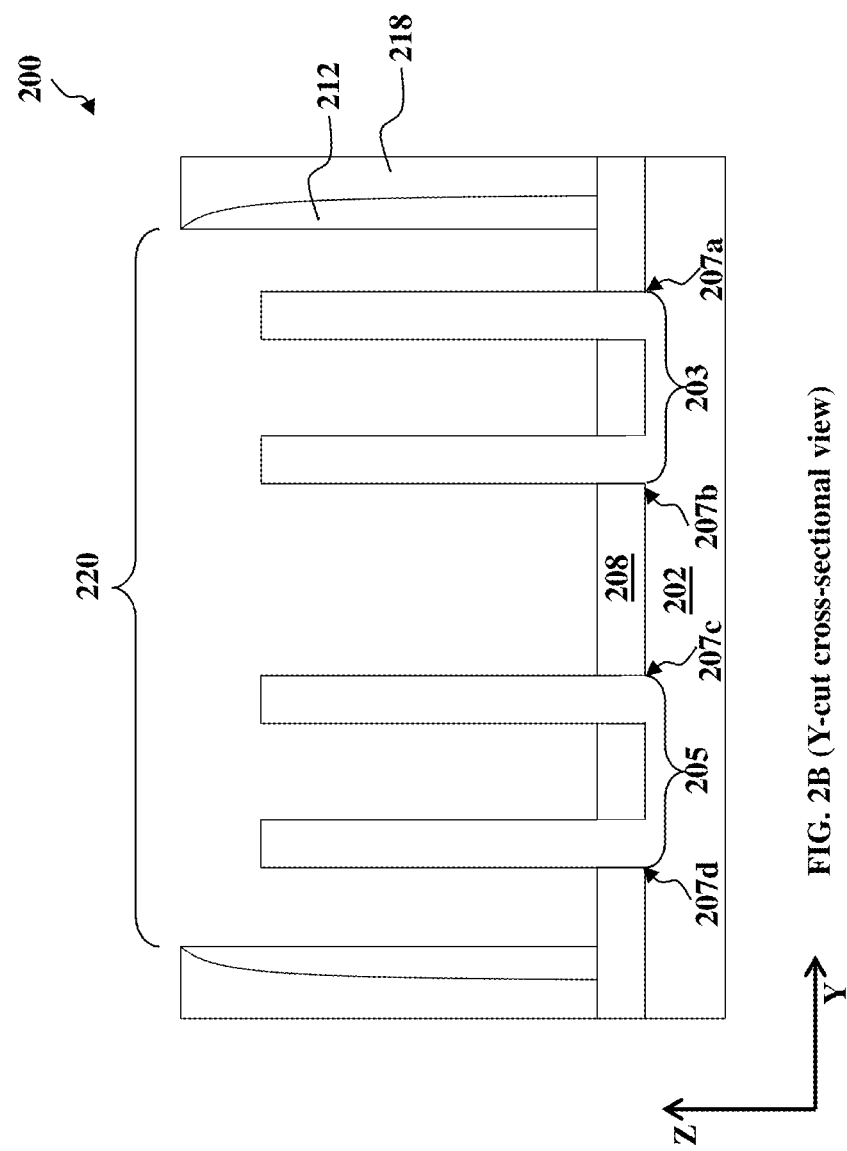
FIG. 2B (Y-cut cross-sectional view)

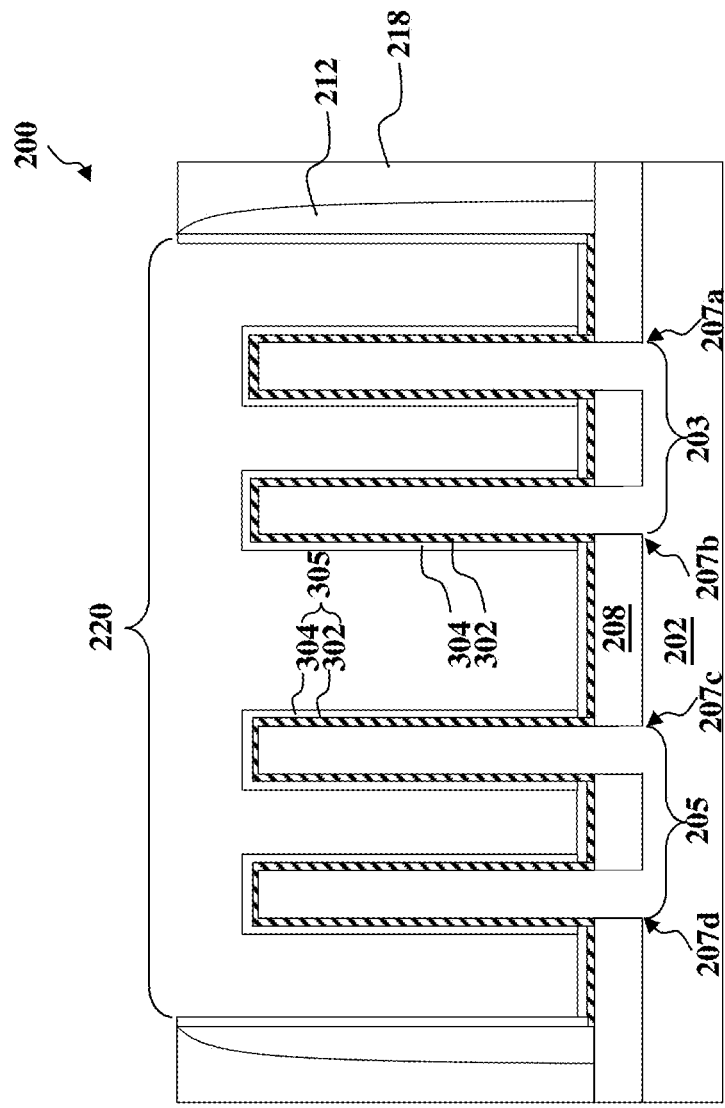

FORMING METAL GATES WITH MULTIPLE THRESHOLD VOLTAGES

PRIORITY DATA

This is a non-provisional application of and claims priority to U.S. Provisional Patent Application Ser. No. 62/764,876, entitled "Common Zero-Thickness Treatment for Multiple Threshold Voltages Realization" and filed Aug. 15, 2018, the entire disclosure of which is hereby incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, gate replacement processes, which typically involve replacing polysilicon gate electrodes with metal gate electrodes, have been implemented to improve device performance, where work function values of the metal gate electrodes are tuned during the gate replacement process to provide various devices having different threshold (operating) voltages (Vt). Although existing gate replacement processes and corresponding Vt tuning processes have been generally adequate for their intended purposes, they have not been entirely satisfactory in all respects as IC technologies shrink.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a top view of an embodiment of a semiconductor device, and FIG. 2B is a Y-cut cross-sectional view of the same semiconductor device, according to various aspects of the present disclosure.

FIGS. 3A, 3B, 3C, 3D, 3E, 3F, 3G, 3H, 3I, 3J, 3K, 3L, 3M, and 3N are additional Y-cut cross-sectional views of an embodiment of the semiconductor device of FIGS. 2A and 2B during intermediate operations of the method of FIG. 1 according to various aspects of the present disclosure.

DETAILED DESCRIPTION

Figure 1:
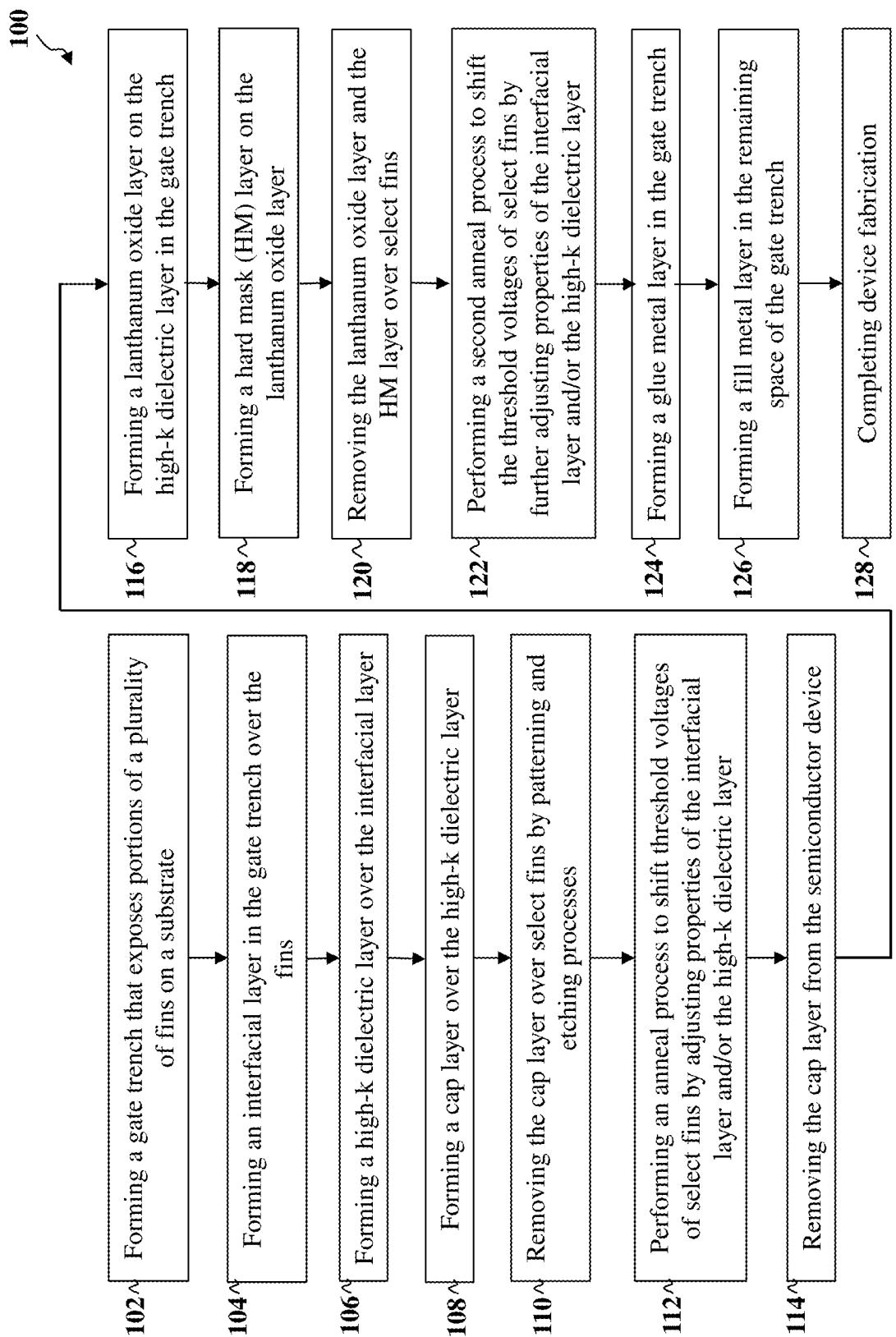
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to forming metal gates with multiple threshold voltages.

During fabrication of a FinFET device, a gate replacement process may be implemented to reduce thermal budget associated with the fabrication steps. For example, during a "gate-last" process, a dummy gate structure is first formed over a substrate as a placeholder before forming other components, e.g., source/drain features. Once the other components have been formed, the dummy gate structure is removed and a metal gate structure is formed in its place. Multiple patterning processes may be implemented to form various material layers within the metal gate structure to improve device performance. In one example, modulating threshold voltage (Vt) of the device has been accomplished by incorporating various material layers (e.g., gate dielectric layers and/or work function metal layers) and adjusting their respective thickness in the metal gate structure. However, as channel lengths decrease, many challenges arise when patterning the various material layers of the metal gate structure. For example, because of decreased channel lengths, the ability to directly pattern work function metal layers is limited because such metal layers across multiple fins are prone to merging. Consequently, the present disclosure contemplates methods of forming and patterning metal gate structures that allow modulation of threshold voltage in devices with reduced features sizes.

According to some aspects, the present disclosure provides a zero-thickness treatment method to realize multiple threshold voltages across multiple fins while avoiding existing issues. The method is referred to "zero-thickness" treatment because, instead of relying on changing thicknesses of work function metal layers to realize different threshold voltages, the present disclosure tunes or modulates threshold voltages by driving into a Vt tuning dielectric layer (e.g., including an interfacial layer and a high-k dielectric layer) materials that shift threshold voltages. Suitable Vt-shifting materials include positive charged atoms (e.g., nitrogen or phosphorous) and/or dipole-forming materials (e.g., lanthanum oxide). Such materials may be driven-in using thermal annealing or plasma treatment to shift Vt values. As a result, different Vt values may be achieved on multiple fins without having to build work function metal layers of varying thicknesses on top of gate dielectric layers. Multiple fins have the same thickness of dielectric layers and the same thickness of metal layers. The overall thickness is reduced compared to existing gate structures that have multiple threshold voltages. Thus, multiple threshold voltages may be realized in FinFET device structures that have smaller fin-to-fin pitches.

Referring now to FIG. 1, a flow chart of a method 100 for forming a semiconductor device 200 is illustrated according to various aspects of the present disclosure. The method 100 is merely an example and is not intended to limit the present disclosure to what is explicitly illustrated in the method 100. Additional operations can be provided before, during, and after the method 100, and some operations described can be replaced, eliminated, or moved around for additional embodiments of the method. The method 100 is described below in conjunction with FIGS. 2A-2B and FIGS. 3A-3N, which illustrate a portion of the semiconductor device 200 during the method 100. FIG. 2A is a fragmentary top view of the device 200, and FIG. 2B is a fragmentary Y-cut cross-sectional view of the device 200 at the same stage. FIGS. 3A-3I are fragmentary Y-cut cross-sectional views of the device 200 (same view as FIG. 2B) at intermediate operations of the method 100. In FinFET devices, fins may extend in a first direction called an X-cut direction, and metal gates may extend in a second direction called a Y-cut direction. Thus, the Y-cut cross-sectional views in FIG. 2B and FIGS. 3A-3N run in parallel with a length direction of the metal gates and perpendicular to a length direction of the fins.

The device 200 may be an intermediate device (or an IC structure) fabricated during processing of an IC that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, although the device 200 as illustrated is a three-dimensional FinFET device, the present disclosure may also provide embodiments for fabricating planar FET devices.

Referring to FIG. 1 and FIGS. 2A-2B, at the beginning of the method 100 a starting semiconductor device 200 is provided and includes a substrate 202 having a first region 203 and a second region 205, isolation structures 208 formed over the substrate 202 separating various components of the device 200, gate spacers 212 as well as an interlayer dielectric (ILD) layer 218 formed on the isolation structures 208. In an embodiment, the first region 203 includes two fins, a fin 207a and a fin 207b, while the second region 205 includes two fins, a fin 207c and a fin 207d. As shown in FIG. 2B, fins 207a-207d are aligned from right to left, but the present disclosure works with any order of the fins 207a-207d, which may or may not be immediately adjacent to each other.

At operation 102, gate trenches 220 and 222 are formed to exposes portions of the fins 207a-207d. As shown in FIG. 2B, the gate spacers 212 and the ILD layer 218 define two gate trenches 220 and 222, which are to be filled by metal gates. From the top view of FIG. 2A, the fins 207a-207d are generally covered by the ILD layer 218, but the gate trenches 220 and 222 each expose a channel region of the fins 207a-207d. For purpose of simplicity, the operations of the method 100 are illustrated with respect to the gate trench 220 (but not gate trench 222 as it undergoes the same fabrication processes).

In some embodiments, the gate trench 220 is formed by removing a dummy gate structure that engages the fins 207a-207d, thereby exposing the channel region of the fins 207a-207d. The dummy gate structure removed at operation 102 may include one or more material layers, such as an oxide layer (i.e., a dummy gate dielectric layer), a polysilicon layer (i.e., a dummy gate electrode), a hard mask layer, a capping layer, and/or other suitable layers. In an embodiment, forming the gate trench 220 includes performing an etching process that selectively removes the dummy gate structure using a dry etching process, a wet etching process, an RIE, other suitable methods, or combinations thereof. A dry etching process may use chlorine-containing gases, fluorine-containing gases, and/or other etching gases. The wet etching solutions may include ammonium hydroxide ($NH_4OH$), hydrofluoric acid (HF) or diluted HF, deionized water, tetramethylammonium hydroxide (TMAH), and/or other suitable wet etching solutions.

As shown in FIGS. 2A and 2B, the substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonideor, and/or other suitable materials; an alloy semiconductor such as SiGe, GaAsP, AnnAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The first region 203 may be suitable for forming one or more p-type FinFETs, and the second region 205 may be suitable for forming one or more n-type FinFETs. In alternative embodiments, the first region 203 and the second region 205 may be suitable for forming FinFETs of a similar type, i.e., both n-type or both p-type, with different threshold voltage (Vt) design requirements. This configuration in FIGS. 2A-2B is for illustrative purposes only and does not limit the present disclosure. The fins 207a-207d may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 207a-207d on the substrate 202. The etching process may include dry etching, wet etching, reactive ion etching (RIE), and/or other suitable processes.

Other methods for forming the fins 207a-207d may be suitable. For example, the fins 207a-207d may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 207a-207d. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers.

The gate spacers 212 form sidewalls of the gate trench 220. The gate spacers 212 may include a dielectric material, such as silicon oxide, silicon nitride, silicon carbide, silicon oxynitride, and/or other suitable dielectric materials. The gate spacers 212 may be a single layered structure or a multi-layered structure. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 218 may include a multi-layer structure having multiple dielectric materials. Note that, although not shown in FIG. 2B, the device 200 may include many additional components or features such as source/drain features (formed in fins 207a-207d but outside of the cross-sectional view of FIG. 2B). In the interest of conciseness, the additional components are not described herein.

Figure 3A:
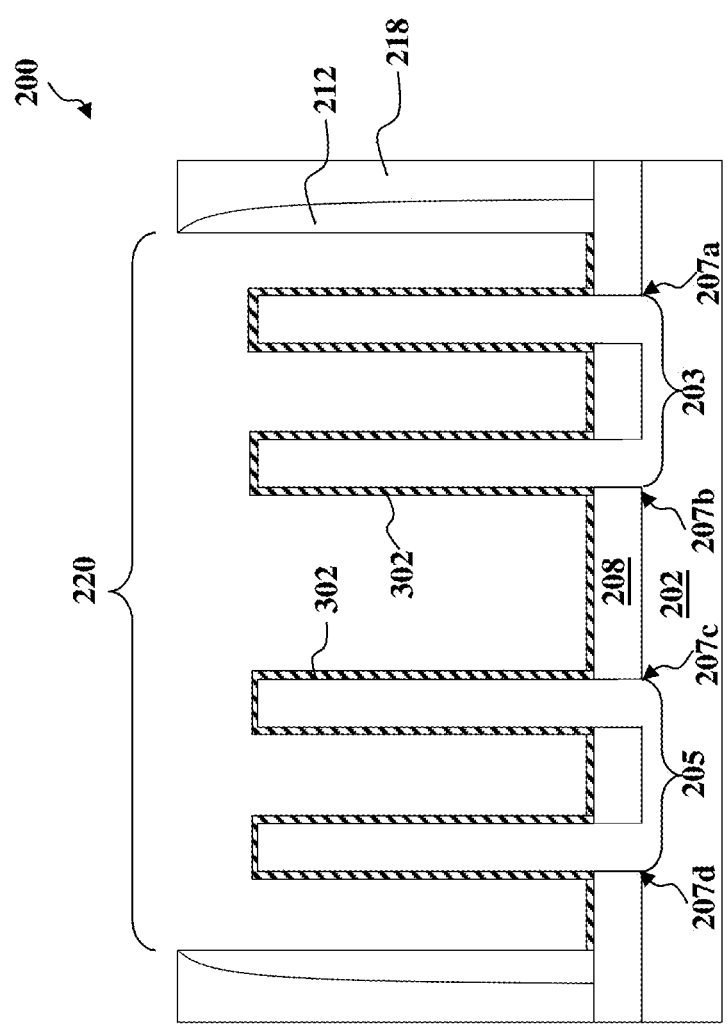

Referring to FIG. 1 and FIG. 3A, the method at operation 104 forms an interfacial layer (IL) 302 in the gate trench 220 over the fins 207a-207d. The interfacial layer 302 may include a dielectric material such as silicon oxide ($SiO_2$) or silicon oxynitride (SiON). The interfacial layer 302 may be formed to any suitable thickness such as about 0.5 nm to about 1.5 nm. In an embodiment, the interfacial layer 302 has a thickness of about 1 nm. The interfacial layer 302 may be formed by any suitable deposition techniques, such as chemical oxidation, thermal oxidation, atomic layer deposition (ALD), chemical vapor deposition (CVD), physical vapor deposition (PVD), low-pressure chemical vapor deposition (LP-CVD), plasma-enhanced CVD (PE-CVD), high-density plasma CVD (HDP-CVD), metal organic CVD (MO-CVD), remote plasma CVD (RP-CVD), plasma enhanced CVD (PE-CVD), low-pressure CVD (LP-CVD), atomic layer CVD (AL-CVD), atmospheric pressure CVD (AP-CVD), and/or other suitable methods.

Referring to FIG. 1 and FIG. 3B, the method 100 at operation 106 forms a high-k dielectric layer 304 in the gate trench 220 over the interfacial layer 302. In the present disclosure, "high-k" dielectric generally refers to one or more materials having a dielectric constant greater than that of silicon oxide ($SiO_2$). The high-k dielectric layer 304 may be formed by ALD and/or other suitable methods to any suitable thickness. In an example embodiment, the high-k dielectric layer 304 has a thickness of about 1 nm to about 2 nm. Alternatively or additionally, the high-k dielectric layer 304 may be formed over an intermediate material layer such that the high-k dielectric layer 304 is not directly in contact with the interfacial layer 302. In some embodiments, the high-k dielectric layer 304 includes hafnium, aluminum, titanium, zirconium, tantalum, silicon, and/or other suitable materials. As described below, the high-k dielectric layer 304, either alone or in combination with the interfacial layer 302, is configured to modulate the threshold voltage of metal gates over the fins 207a-207d. Therefore, both the high-k dielectric layer 304 and the interfacial layer 302 may be considered part of the Vt tuning dielectric layer 305.

Figure 3C:
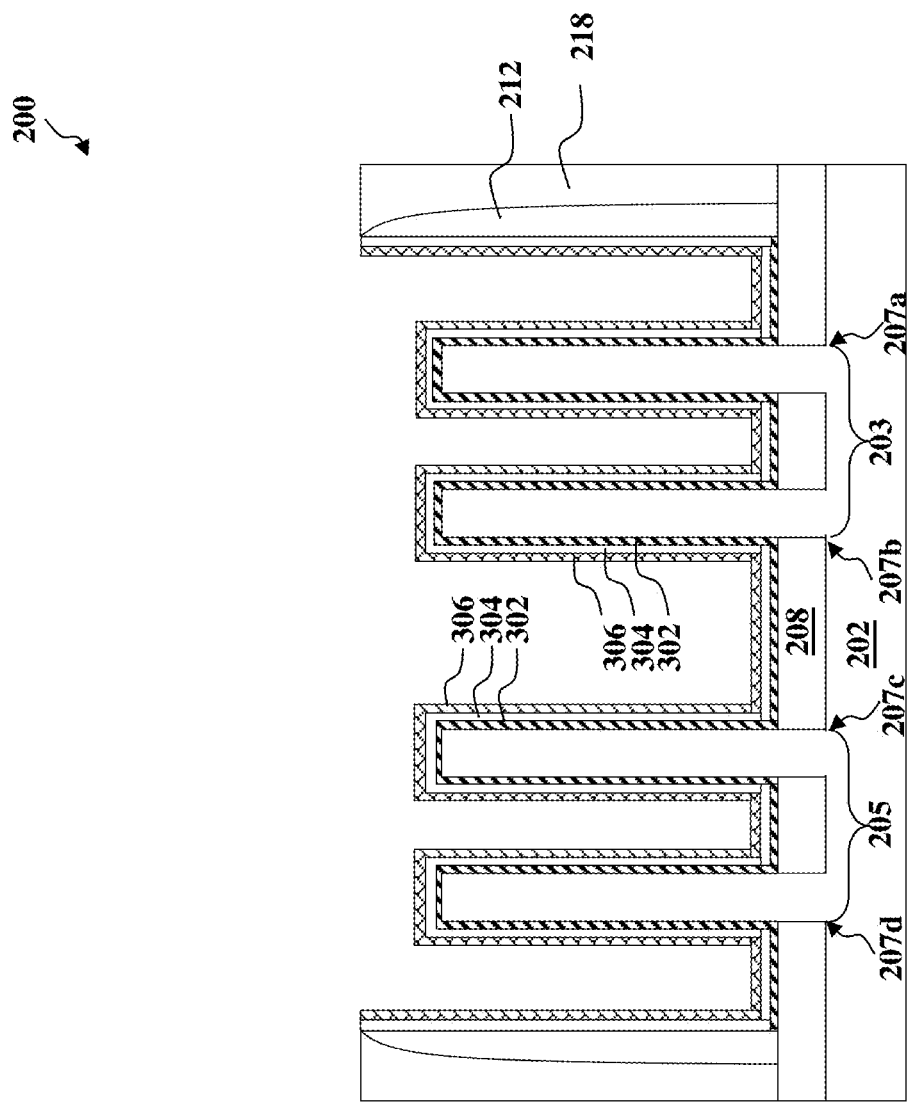

Referring to FIG. 1A and FIG. 3C, the method 100 at operation 108 forms a cap layer 306 over the high-k dielectric layer 304 in the gate trench 220. In many embodiments, the cap layer 306 is configured to protect the underlying high-k dielectric layer 304 from subsequent thermal processes. The cap layer 306 may include a metal nitride, such as TiN, TaN, NbN, or other suitable materials and may be formed by a deposition process such as ALD, CVD, PVD, and/or other suitable processes. The cap layer 306 may have any suitable thickness, such as about 0.5 nm to about 2 nm. In an embodiment, the cap layer 306 is about 1 nm thick.

Figure 3D:
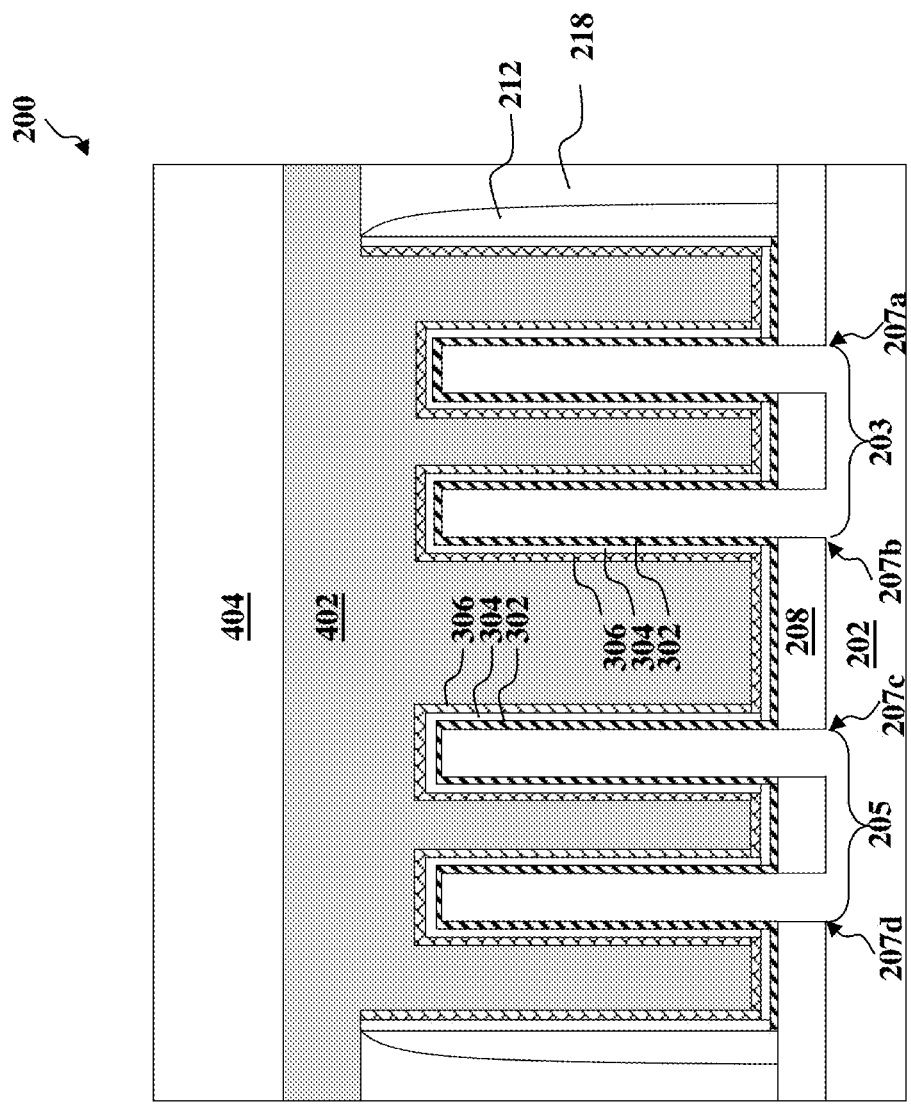
Figure 3E:
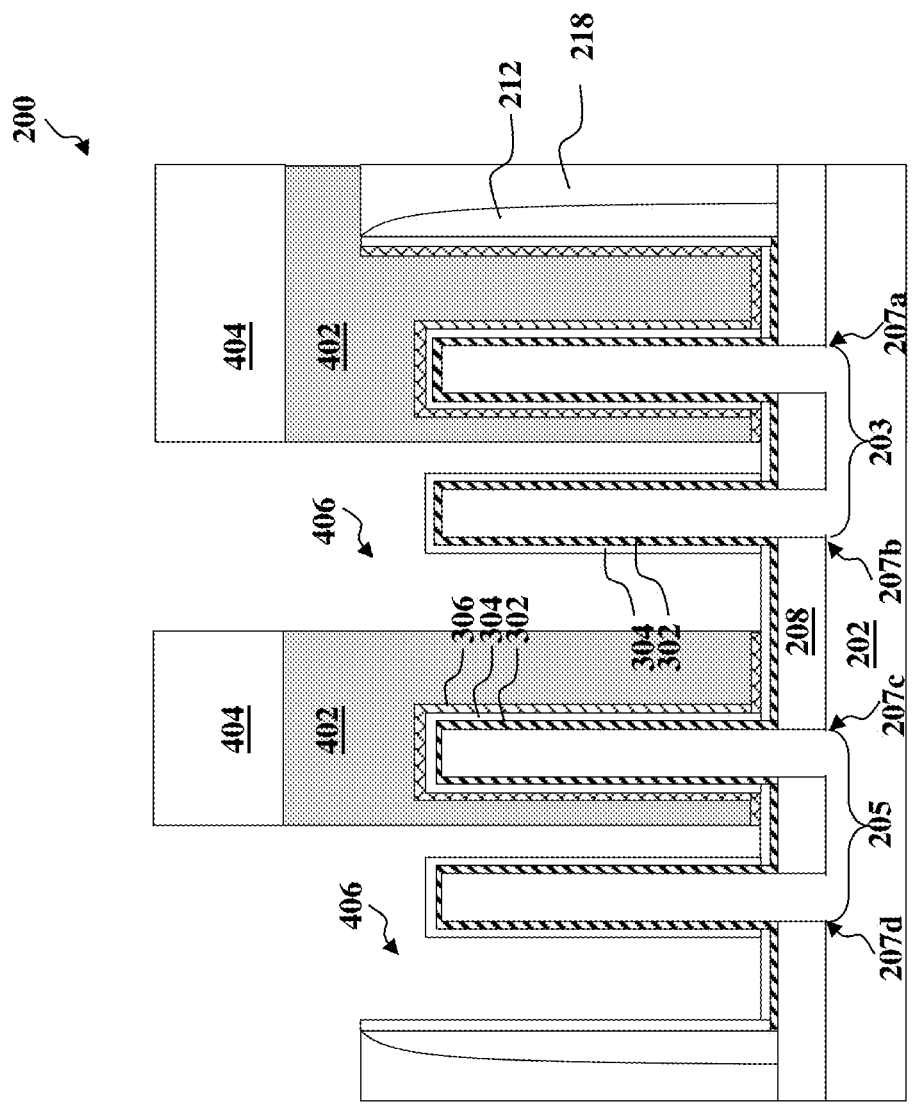

In many embodiments, the cap layer 306 is configured to accommodate subsequently applied patterning processes and is then removed from the gate trench 220 following the completion of the patterning processes. Referring to FIG. 1 and FIGS. 3D-3E, the method 100 at operation 110 removes the cap layer 306 over the fins 207b and 207d by a series of patterning and etching processes, leaving the cap layer 306 over the fins 207a and 207c. As shown in FIG. 3D, the method 100 may first form a masking element—which includes a resist layer 404 and optionally a resist bottom layer 402 such as a bottom antireflective coating (BARC)—over the gate trench 220 as well as portions of the ILD layer 218. As shown in FIG. 3E, the method 100 then proceeds to form openings 406 to expose the cap layer 306 on the fins 207b and 207d but not those on the fins 207a and 207c. The openings 406 may be formed by any suitable processes such as exposing the resist layer 404 and the resist bottom layer 402 to a pattern, performing post-exposure bake processes, developing the resist, or etching (dry etching, wet etching, RIE, etc.), and/or other suitable processes. The masking element is then used for etching recesses into the substrate 202, leaving the fins 207a-207d on the substrate 202. In an embodiment, the openings 406 are formed by a dry etching process utilizing a nitrogen-containing etchant gas (e.g., $N_2$), a hydrogen-containing etchant gas (e.g., $H_2$), a fluorine-containing etchant gas (e.g., $CF_4$, $SF_6$, $CH_2F_2$, $CHF_3$, and/or $C_2F_6$), an oxygen-containing gas, a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, helium, and/or other suitable gases and/or plasmas. In an embodiment, the dry etching process implements a mixture of $N_2$ and $H_2$ gases. Still referring to FIG. 3E, the method 100 removes the exposed portions of the cap layer 306 in the gate trench 220 using an etching process, thereby exposing the high-k dielectric layer 304 on the fins 207b and 207d. In an embodiment, a wet etching process is used, though other etching processes may also be suitable.

A fin may include a FinFET with a source, a drain, and a gate. A threshold voltage of the fin refers to a minimum gate-to-source voltage needed to create a conducting path between the source and the drain of the FinFET. The threshold voltage is impacted by various parameters including the work function of the gate. Generally, the threshold voltage may be modulated by adjusting the thickness of a work function metal layer in a metal gate. However, as feature sizes decrease, controlling thicknesses of multiple work function metal layers during lithography and patterning processes poses many challenges. The present disclosure provides methods of modulating the threshold voltage of a metal gate by tuning properties of the Vt tuning dielectric layer 305. For example, charges and/or dipoles may be introduced into a gate to change its work function. The tuning may replace or supplement adjustments to the properties of the work function metal layer.

Figure 3F:
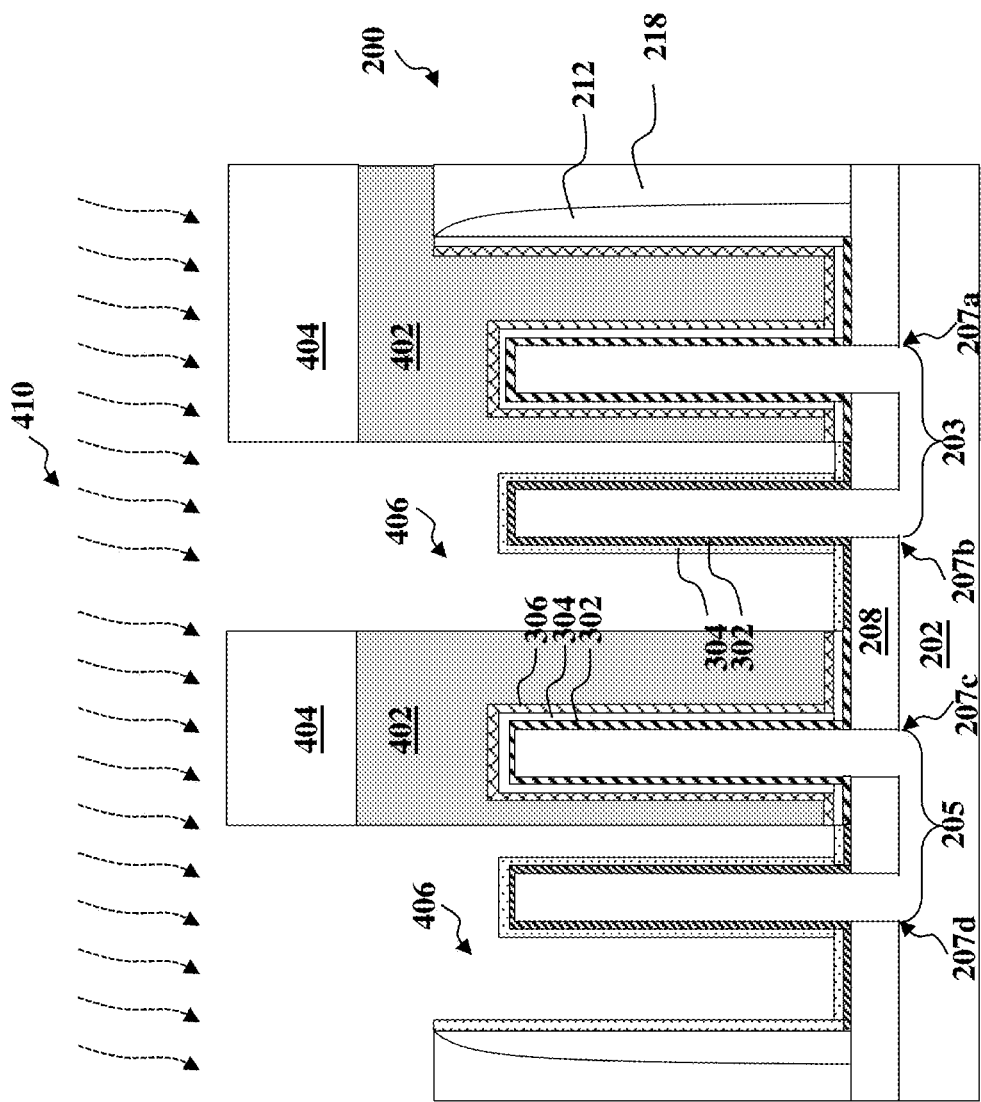

As parts of the Vt tuning dielectric layer 305, the high-k dielectric layer 304 and the interfacial layer 302 are further processed to modulate the threshold voltages of select fins. Referring to FIG. 1 and FIG. 3F, the method 100 at operation 112 performs an anneal process 410 on the device 200 to shift threshold voltages of the fins 207b and 207d. The device 200 is exposed to a suitable gas that contains nitrogen (N), phosphorus, or other elements providing positive charges. For example, a gas comprising nitrogen gas, ammonia ($NH_3$) gas, or a mixture of nitrogen and ammonia gases may provide nitrogen atoms as positively charged atoms. In an embodiment of a mixed gas, a ratio between nitrogen and ammonia molecules is about 1:1 or more. The anneal process 410 is performed to drive positively charged nitrogen atoms ($N^{+3}$ in ammonia) into at least the high-k dielectric layer 304 and optionally into the interfacial layer 302. The anneal process 410 may be performed under any suitable conditions, for example, at temperatures between about 500 degrees Celsius (° C.) to about 800° C. Such a temperature range helps tailor the nitrogen distribution in the interfacial layer 302 and the high-k dielectric layer 304 without degrading the interface between the interfacial layer 302 and the fins 207b and 207d due to nitrogen accumulation. The anneal process 410 may be performed for a relatively long period such as 10 seconds to 100 seconds (called "soaking") or a relatively short period such as hundreds of milliseconds to a few seconds (e.g., 200 milliseconds to 2 seconds) (called "spiking").

Once positively charged atoms such as nitrogen are introduced into portions of the Vt tuning dielectric layer 305, the work functions and therefore threshold voltages of corresponding fins may shift. For example, the nitrogen atoms change the threshold voltages of the fins 207b and 207d (but not the fins 207a and 207c because nitrogen atoms were not introduced thereon due to the presence of the cap layer 306). The amount or percentage of nitrogen inside the Vt tuning dielectric layer (e.g., 5%-15% by atomic count) may affect how much the threshold voltage shifts. Nitrogen atoms may be distributed in the Vt tuning dielectric layer 305 in various ways. In some embodiments, nitrogen atoms stay in the high-k dielectric layer 304. In other embodiments, nitrogen atoms diffuse into both the high-k dielectric layer 304 and the interfacial layer 302. The concentration of nitrogen inside each layer may or may not be uniform. Further, incorporated nitrogen may or may not react with the Vt tuning dielectric layer 305 to form new materials. For example, when the concentration of nitrogen is high, it may react with silicon dioxide to form silicon oxynitrid.

Although FIG. 3F illustrates using the anneal process 410 to drive in positively charged atoms into the Vt tuning dielectric layer 305, another suitable process such as a plasma treatment process may also be used, either by itself or in combination with the anneal process 410, to achieve similar purposes. In some embodiments, the plasma treatment process uses a nitrogen-containing gas at a suitable flow rate, for example, in a range from about 500 standard cubic centimeters per minute (sccm) to about 2000 sccm. Plasma is applied to the surface of the Vt tuning dielectric layer 305 to drive in nitrogen atoms. Further, although positively charged atoms are used to describe principles disclosed to shift threshold voltages, negatively charged atoms may be similarly used under suitable circumstances.

Figure 3G:
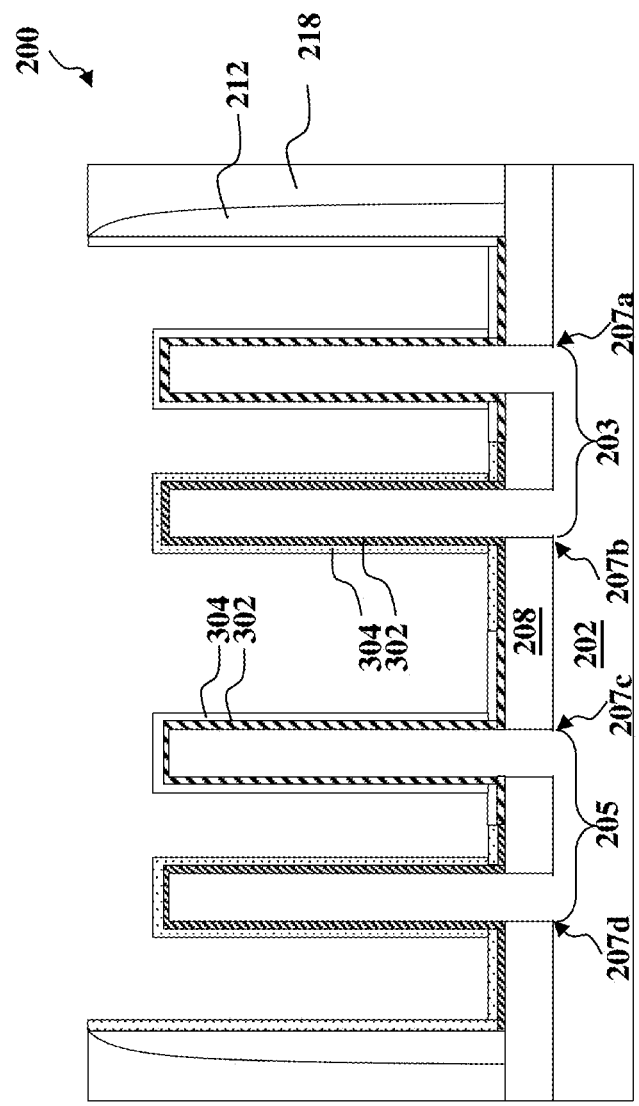

Referring to FIG. 1 and FIG. 3G, the method 100 at operation 114 removes any remaining cap layer 306 from the device 200. To remove the cap layer 306, the method 100 may first remove the resist layer 404 and the resist bottom layer 402. Any suitable etching process may be used.

Figure 3H:
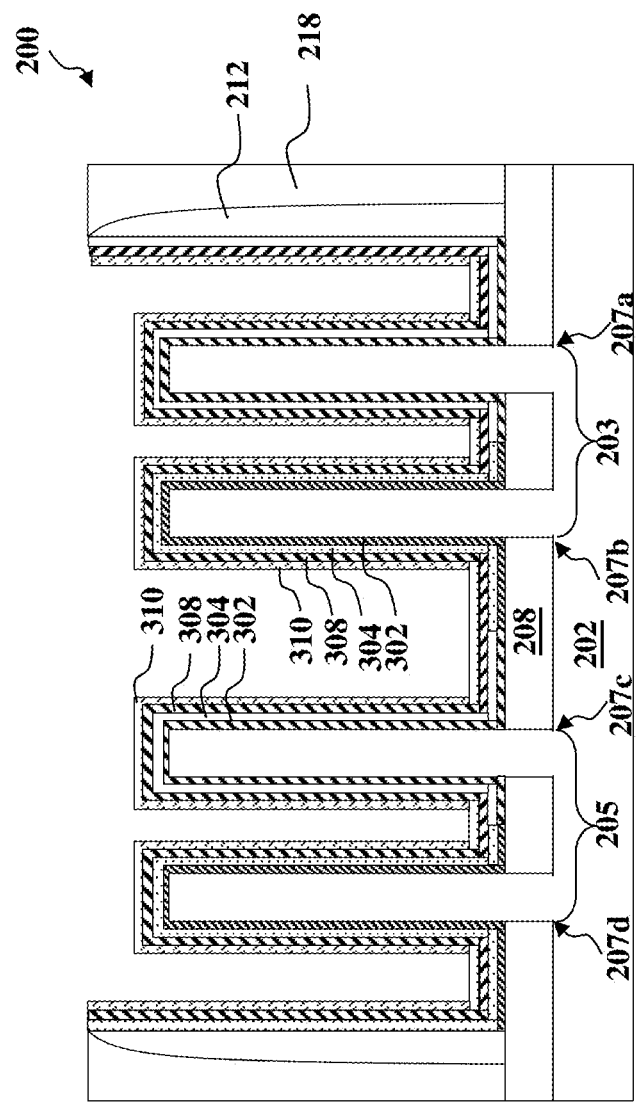

Referring to FIG. 1 and FIG. 3H, the method 100 at operation 116 forms a lanthanum oxide layer 308 on the high-k dielectric layer 304 in the gate trench 220. In many embodiments, the lanthanum oxide layer 308 is configured to further modulate the threshold voltages of the fins 207a-207d. The lanthanum oxide layer 308 may include any suitable form of lanthanum oxide such as $La_2O_3$ or other suitable materials. The lanthanum oxide layer 308 may be formed by a deposition process such as ALD, CVD, PVD, and/or other suitable processes. Depending on how much lanthanum needs to be diffused to underlying layers, the lanthanum oxide layer 308 may be formed to any suitable thickness.

Still referring to FIG. 1 and FIG. 3H, the method 100 at operation 118 forms a hard mask (HM) layer 310 on the lanthanum oxide layer 308. The HM layer 310 may include any suitable material such as silicon, silicon carbonitride (SiCN), hafnium oxide ($HfO_2$), alumina ($Al_2O_3$), zirconium oxide ($ZrO_2$), titanium nitride (TiN), tungsten carbide (WC), or combinations thereof. The HM layer 310 may be formed by PVD, CVD, ALD, plating, or other suitable methods. In many embodiments, the HM layer 310 is configured to accommodate subsequent patterning of the lanthanum oxide layer 308 and is then removed from the gate trench 220 following the completion of the patterning processes. The HM layer 310 is helpful because directly patterning the lanthanum oxide layer 308 is sometimes difficult because lanthanum oxide is water absorbent and prone to reaction with photoresist or BARC. The HM layer 310 helps separate lanthanum oxide from the photoresist or BARC.

Figure 3I:
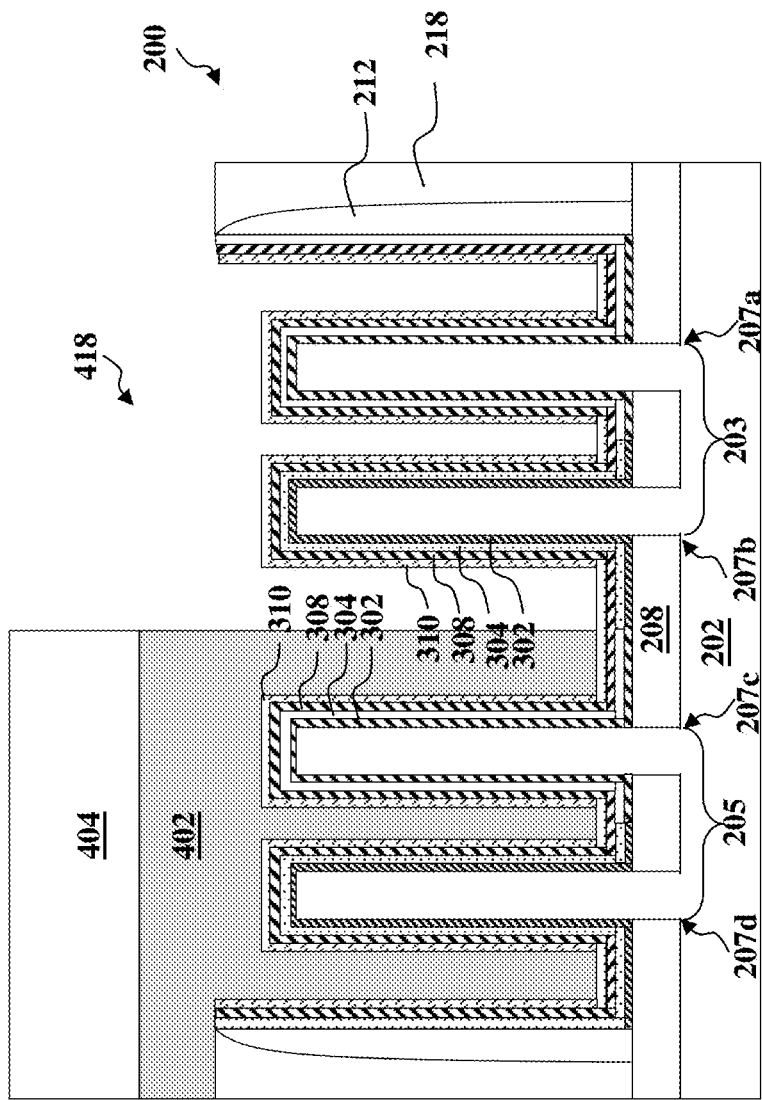
Figure 3J:
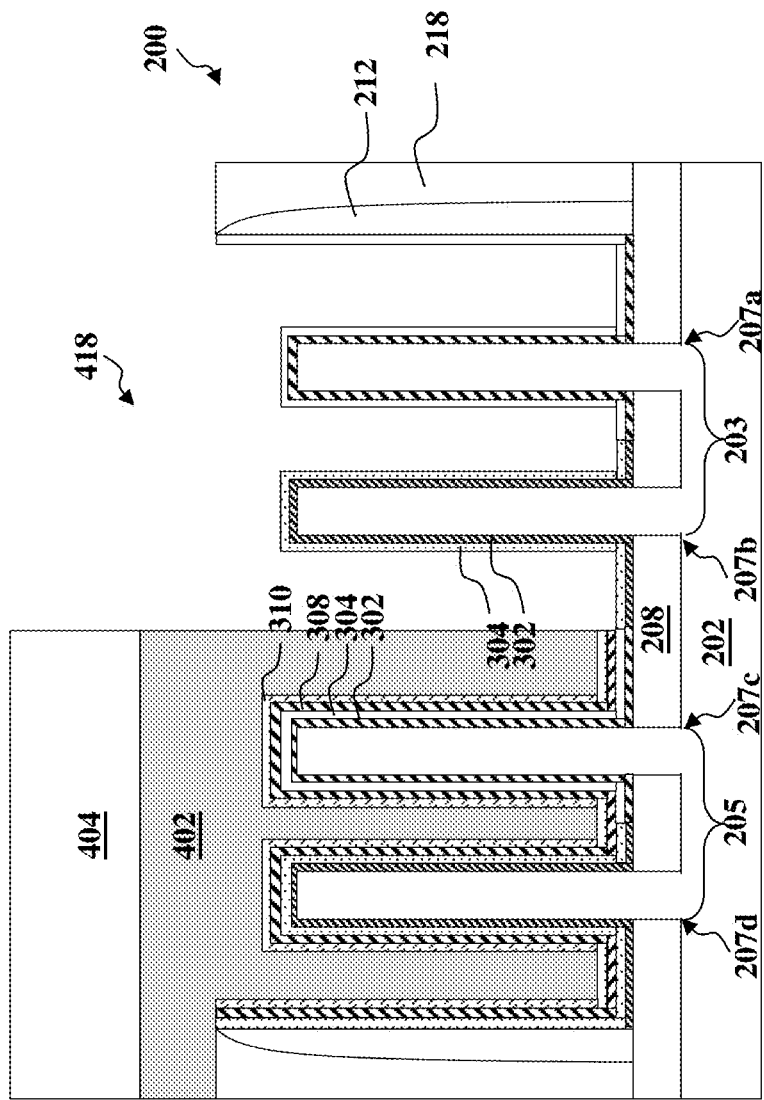

Referring to FIG. 1 and FIGS. 3I-3J, the method 100 at operation 120 patterns the lanthanum oxide layer 308 and the HM layer 310 by removing their portions formed on the fins 207a and 207b. As shown in FIG. 3I, the method 100 may first form a masking element over the gate trench 220, and then proceeds to form an opening 418 to expose the HM layer 310 on the fins 207a and 207b but not the fins 207c and 207d. The masking element may be similar to what was used earlier for patterning the cap layer 306 (FIGS. 3D and 3E). For example, the masking element includes a resist layer 404 and a resist bottom layer 402 such as BARC. The opening 418 may be formed by any suitable processes such as exposing the resist layer 404 and the resist bottom layer 402 to a pattern, performing post-exposure bake processes, developing the resist, or etching (dry etching, wet etching, RIE, etc.), and/or other suitable processes. As shown in FIG. 3J, the method 100 removes the exposed portions of the HM layer 310 as well as underlying portions of the lanthanum oxide layer 308 in the opening 418. In some embodiments, the HM layer 310 and the lanthanum oxide layer 308 may be removed in separate processes. Any suitable etching process including dry etching, wet etching, RIE, and/or other suitable processes may be used. The resist layer 404 and the resist bottom layer 402 protect portions of the lanthanum oxide layer 308 that are disposed on the fins 207c and 207d against etchants used in operation 120, thereby allowing patterning of the lanthanum oxide layer 308.

Figure 3K:
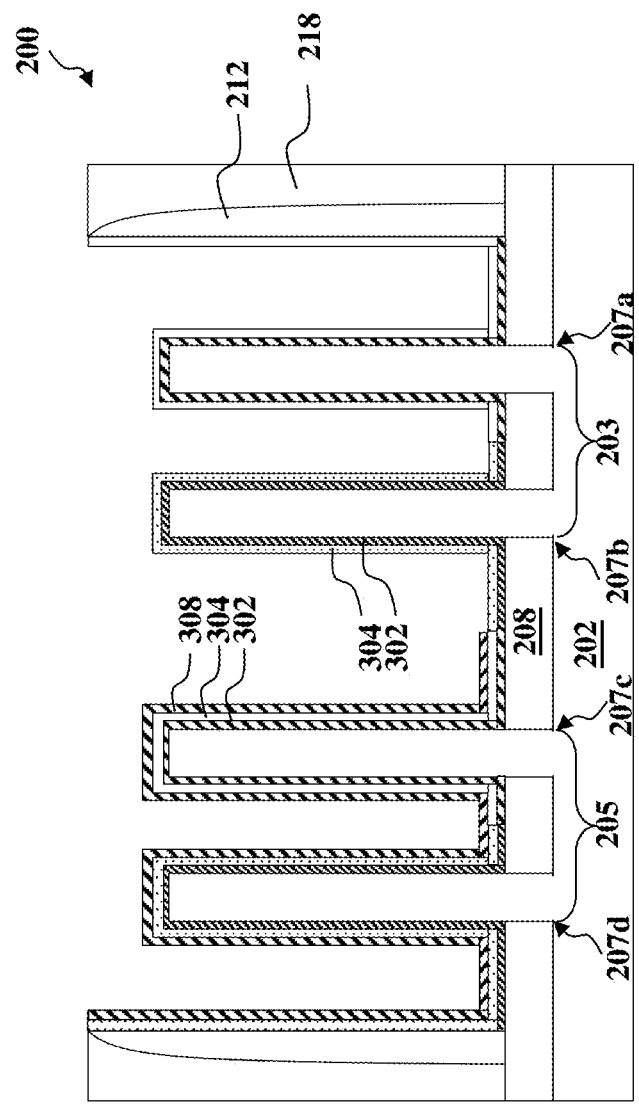

Referring to FIG. 1 and FIG. 3K, the method 100 at operation 122 removes the remaining portions of the resist layer 404 and the resist bottom layer 402, as well as the remaining portions of the HM layer 310. Removing the HM layer 310 exposes the lanthanum oxide layer 308 disposed on the fins 207c and 207d to facilitate the subsequent drive-in process. Any suitable removal processes including dry etching, wet etching, and/or RIE may be used. In some embodiments, the resist layer 404, the resist bottom layer 402, and the HM layer 310 may be removed in separate processes.

Figure 3L:
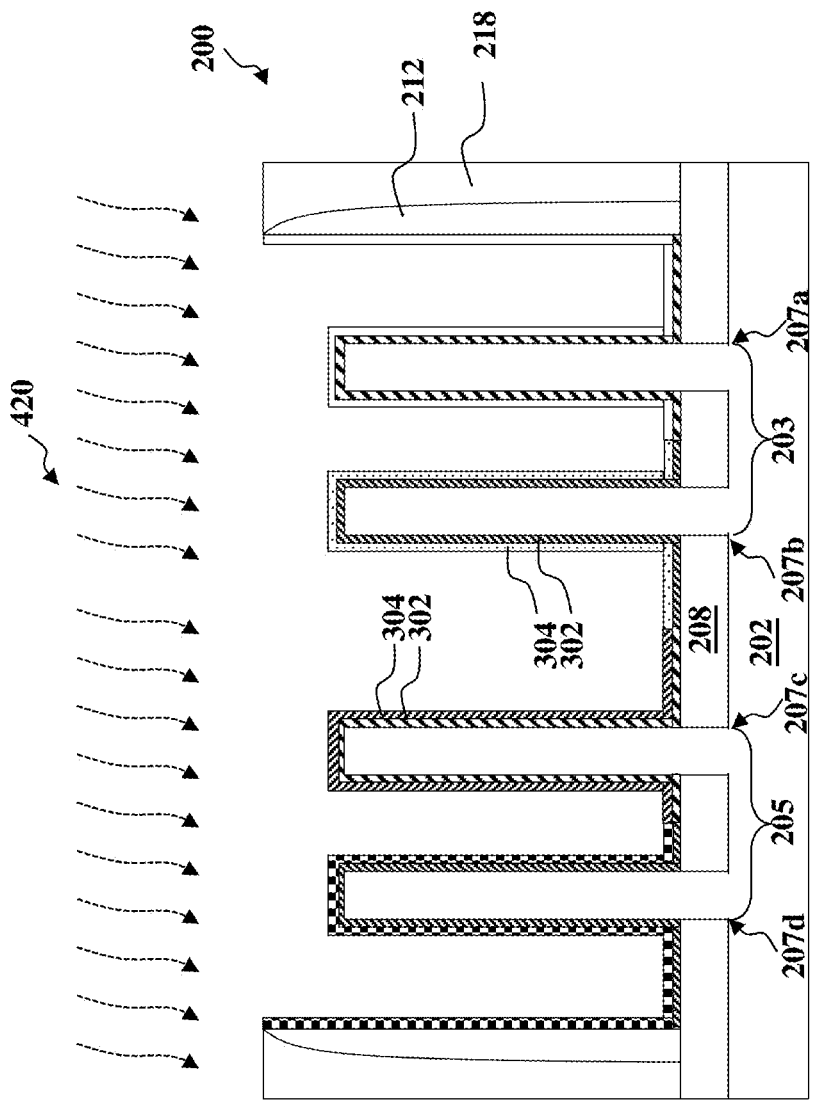

Referring to FIG. 1 and FIG. 3L, the method 100 at operation 124 performs a second anneal process 420 on the device 200 to shift the threshold voltages of select fins by further adjusting properties of the Vt tuning dielectric layer 305. The anneal process 420 may be performed under any suitable conditions, for example, at temperatures between about 600° C. to about 850° C. Such a temperature range helps drive lanthanum into the high-k dielectric layer 304 (and in some cases the interfacial layer 302) for dipole formation without degrading the high-k dielectric layer 304. The anneal process 420 may be performed for a relatively long period such as 10 seconds to 100 seconds (called "soaking") or a relatively short period such as hundreds of milliseconds to a few seconds (e.g., 300 milliseconds to 1 second) (called "spiking").

The anneal process 420 drives lanthanum, and possible a small amount of lanthanum oxide contained in the lanthanum oxide layer 308 into the underlying Vt tuning dielectric layer 305, thereby leading to a Vt shift therein. In the anneal process 420, lanthanum atoms are displaced from the lattice structure of lanthanum oxide at elevated temperatures, for example, because the lattice energy that holds lanthanum and oxygen atoms together is relatively low. As shown in FIG. 3L, since the lanthanum oxide layer 308 only covers portions of the high-k dielectric layer 304 disposed on the fins 207c and 207d, the lanthanum oxide layer 308 only diffuses into such portions of the Vt tuning dielectric layer 305 (and not into the Vt tuning dielectric layer 305 disposed on the fins 207a and 207b). As a result, the threshold voltages of the fins 207c and 207d are shifted (but not 207a and 207b) at operation 124.

Annealing causes lanthanum atoms to travel downward from the lanthanum oxide layer 308 into the high-k dielectric layer 304. In some embodiments, lanthanum atoms form dipoles at the interface of the high-k dielectric layer 304 and the underlying interfacial layer 302. The dipoles may cause a change in work function and therefore threshold voltage. When the interfacial layer 302 is made of materials such as silicon dioxide, the interfacial layer 302 may not have vacant spots left in its crystalline structure for lanthanum atoms to fill. As a result, lanthanum and oxygen atoms may not substantially diffuse into the interfacial layer 302. In some embodiments, the lanthanum atoms may accumulate at higher concentrations at or near the interface of the high-k dielectric layer 304 and the underlying interfacial layer 302 than at other depths (e.g., the upper portions of the high-k dielectric layer 304). Note that, although lanthanum is used herein as an example metal included in the layer 308, suitable other metals such as yttrium (Y) and strontium (Sr) that can form Vt-shifting dipoles may also be used under appropriate circumstances. Dipoles may be formed as a result of a significant difference between electronegativity of the metal and that of the high-k dielectric layer 304.

Still referring to FIG. 3L, after the anneal process 420, the remaining portions of the lanthanum oxide layer 308 (now with depleted lanthanum oxide) may be removed. As a result, the entire surface of the high-k dielectric layer 304 in the gate trench 220 is exposed again, now with enriched lanthanum oxide content. The removal of the lanthanum oxide layer 308 may use any suitable etching process. As illustrated in FIG. 3L, the Vt tuning dielectric layer 305 now has a substantially uniform thickness across top surfaces of the fins 207a-207d. In an embodiment, the Vt tuning dielectric layer 305 has the interfacial layer 302 which is about 1 nm thick and the high-k dielectric layer 304 which is about 1.5 nm thick, leading to a total thickness of about 2.5 nm.

Figure 3M:
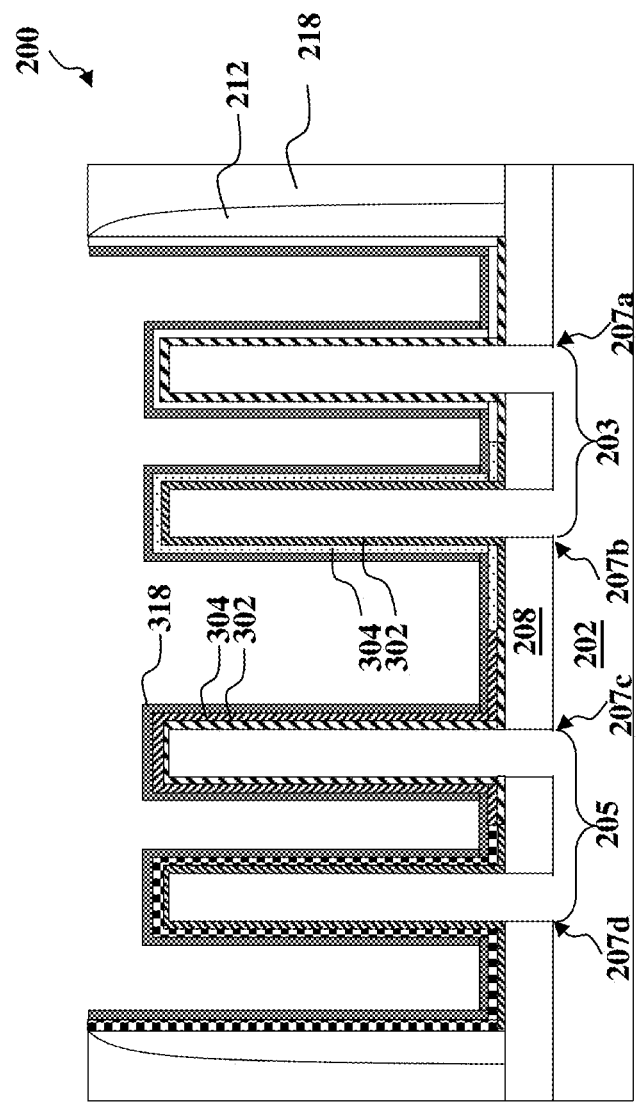

Referring to FIG. 1 and FIG. 3M, the method 100 at operation 124 forms a glue metal layer 318 in the gate trench 220 over the high-k dielectric layer 304. The same glue metal layer 318 of uniform thickness may be formed to cover the fins 207a-207d. The glue metal layer 318 serves multiple purposes. For example, the glue metal layer 318 uses materials that promote or enhance adhesion to the fill metal layer 320, which is to be formed on the glue metal layer 318. The glue metal layer 318 also provides the desired work function and Vt for the fin 207a, as the Vt of the fin 207a cannot be modulated by the Vt tuning dielectric layer 305. That is because the portion of the Vt tuning dielectric layer 305 that covers the fin 207a has not incorporated either nitrogen or lanthanum oxide. As illustrated herein, the fin 207a is used to implement p-type FinFETs, so the glue metal layer 318 is a p-type work function metal layer. The glue metal layer 318 has a relatively small thickness (e.g., less than 3 nm or about 1 nm to about 3 nm) to achieve a relatively large work function for the p-type FinFET on the fin 207a.

The glue metal layer 318 uses any suitable metal configured to serve as a work function metal of the fin 207a. The choice of metal to be included in the glue metal layer 318 may be determined by an overall threshold voltage desired for a FET device (e.g., n-type or p-type) formed on the fin 207a. Exemplary p-type work function metals include TiN, TaN, Ru, Mo, Al, WN, $ZrSi_2$, $MoSi_2$, $TaSi_2$, $NiSi_2$, WN, and/or other suitable p-type work function materials. Note that, if the fin 207a is used to implement n-type FinFETs, suitable n-type work function metals such as Ti, Ag, TaAl, TaAlC, TiAlN, TaC, TaCN, TaSiN, Mn, Zr, and/or other suitable n-type work function materials may instead be used. Note that the glue metal layer 318 need not determine the work function and Vt for the fins 207b-207d because the Vt of the fins 207b-207d can be modulated by the Vt tuning dielectric layer 305. The glue metal layer 318 may be deposited by ALD, CVD, PVD, and/or other suitable process.

In some embodiments, the Vt tuning dielectric layer 305 and the glue metal layer 318 together determine effective work functions of the FinFETs on the fins 207a-207d. Since the Vt tuning dielectric layer 305 and the glue metal layer 318 have generally uniform thicknesses across the fins 207a-207d, the resulting effective work function metal layer also has a generally uniform thickness across the fins 207a-207d. That is, a total thickness of the Vt tuning dielectric layer 305 and the glue metal layer 318 is substantially uniform across top surfaces of the fins 207a-207d. This differs from existing technologies where fins need to have work function metal layers of different thicknesses in order to achieve different threshold voltages. Specifically, in conventional FinFETs, a glue metal layer is formed on work function metal layers of different thicknesses (not directly on dielectric layers). In contrast, since the Vt tuning dielectric layer 305 disclosed herein allows for modulation of threshold voltages, the glue metal layer 318 can be formed directly on the high-k dielectric layer 304 (without needing any thickness-varying intermediate metal layers in between).

The present disclosure increases the number of possible Vt values with less material layers. The overall thickness of the effective work function layer is relatively thin. As a benefit, there is now sufficient space to pattern such layers even when a pitch distance between fins becomes smaller. Without techniques disclosed herein, the work function metal layers would be thicker, and there may be no room between fins to properly fill the glue metal layer. Multiple threshold voltages may be realized herein in smaller transistor devices.

Figure 3N:
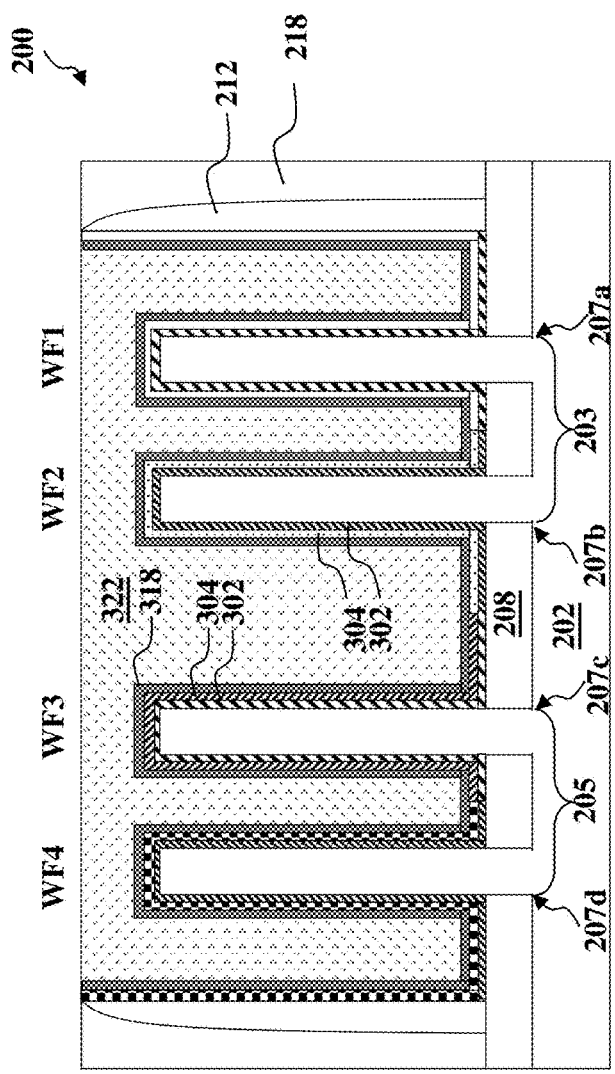

Referring to FIG. 1 and FIG. 3N, the method 100 at operation 126 forms a fill metal layer 322 in the remaining space of the gate trench 220 to complete a metal gate structure. The fill metal layer 322 may include copper (Cu), tungsten (W), aluminum (Al), cobalt (Co), and/or other suitable materials. The fill metal layer 322 may be formed by ALD, CVD, PVD, plating, and/or other suitable processes. A CMP process may be performed to remove excess materials to planarize a top surface of the device 200. As a result, the fill metal layer 322 may have a substantially uniform thickness across top surfaces of the fins 207a-207d. After formation of the fill metal layer 322, the gate structure is complete. The gate structure (including the interfacial layer 302, the high-k dielectric layer 304, the glue metal layer 318, and the fill metal layer 322) is formed over and surrounding a channel, which sits between a source and a drain on each fin. Thus, each fin is part of a FinFET, which includes a source, a drain, a channel, and a gate. When multiple sources, drains, and channels are implemented onto a fin, the fin may be considered part of multiple FinFETs.

As shown in FIG. 3N, by incorporating materials into the same two layers (the interfacial layer 302 and the high-k dielectric layer 304) of the VT tuning dielectric layer 305, four different work functions are realized on the four fins 207a-207d. From right to left, the p-type fin 207a has a first work function (WF1), the p-type fin 207b has a second work function (WF2), the n-type fin 207c has a third work function (WF3), and the n-type fin 207d has a fourth work function (WF4). WF1 is higher than WF2 due to the incorporation of positively charged atoms into the fin 207b. Since dipole formation by lanthanum drive-in in the fin 207c yields a more significant work function shift as compared to that by the incorporation of positively charged atoms in the fin 207b, WF2 is higher than WF3. Further, WF3 is higher than WF4 due to the incorporation of positively charged atoms into the fin 207d along with the presence of dipoles induced by the lanthanum drive-in. As a result, the four fins 207a-207d possess four different work functions (WF1-WF4) that may serve for four threshold voltages, respectively. In an embodiment, the fin 207a has a p-type low Vt (P-LVt) requiring a WF of 4.7 electron volts (eV), the fin 207b has p-type standard Vt (P-SVt) requiring a WF of 4.6 eV, the fin 207c has a n-type standard Vt (N-SVt) requiring a WF of 4.5 eV, and the fin 207d has a n-type low Vt (N-LVt) requiring a WF of 4.4 eV. Thus, using techniques disclosed herein, specific Vt values and their corresponding work functions can be flexibly designed and tailored to fit various application needs.

Although the present disclosure mainly describe two layers (the interfacial layer 302 and the high-k dielectric layer 304) being used as the Vt tuning dielectric layer 305, it should be understood that any suitable number of layers may be used to realize diverse work functions. For instance, an additional layer may be added to realize more Vt values. Select portions of the additional layer may also be processed (e.g., via annealing) to increase the number of possible Vt values.

Subsequently, at operation 128, the method 100 performs additional processing steps to complete fabrication of the device 200. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, and/or other suitable materials. The metal silicides may include nickel silicide, cobalt silicide, tungsten silicide, tantalum silicide, titanium silicide, platinum silicide, erbium silicide, palladium silicide, and/or other suitable metal silicides.

Although not intended to be limiting, one or more embodiments of the present disclosure provide many benefits to a semiconductor device and the formation thereof. For example, embodiments of the present disclosure provide methods for realizing multiple threshold voltages on a Vt tuning dielectric layer with a uniform and small thickness across fins ("zero-thickness treatment"). Gap-fill capability is improved on smaller FinFET devices. Patterning material layers at an early stage yields a larger patterning window. Further, common glue metal layer and fill metal layers are formed for multiple threshold voltages without extra patterning. Simplified fabrication reduces costs. The disclosed techniques may replace or supplement other Vt tuning techniques such as multiple patterning gate (MPG).

In one aspect, the present disclosure is directed to a method of fabricating an integrated circuit (IC) structure, including forming a gate trench that exposes a portion of each of a plurality of fins and forming a threshold voltage (Vt) tuning dielectric layer in the gate trench over the plurality of fins. Properties of the Vt tuning dielectric layer are adjusted during the forming to achieve a different Vt for each of the plurality of fins. The method also includes forming a glue metal layer over the Vt tuning dielectric layer; and forming a fill metal layer over the glue metal layer. The fill metal layer has a substantially uniform thickness over top surfaces of the plurality of fins.

In another aspect, the present disclosure is directed to a method of fabricating an integrated circuit (IC) structure, including providing a device structure. The device structure includes: a substrate, first, second, third, and fourth fins disposed over the substrate and extending in a first direction, and a gate trench disposed over the substrate and extending in a second direction that intersects the first direction, the gate trench exposing a portion of each of the fins. The method further includes forming an interfacial layer over the exposed portions of the first, second, third, and fourth fins; forming a high-k dielectric layer over the interfacial layer; and forming a cap layer over the high-k dielectric layer. The cap layer is selectively removed to expose portions of the high-k dielectric layer that are over the second and fourth fins. The method also includes driving positively charged atoms into the exposed portions of the high-k dielectric layer to shift a threshold voltage (Vt) of the second fin and a Vt of the fourth fin; and removing remaining portions of the cap layer.

In yet another aspect, the present disclosure is directed to a semiconductor device, including a semiconductor substrate; a plurality of fins disposed over the semiconductor substrate; and a gate structure disposed across the plurality of fins. The gate structure includes a threshold voltage (Vt) tuning dielectric layer disposed over the plurality of fins and configured to have different characteristics over each of the plurality of fins, such that a different Vt is achieved for each of the plurality of fins. The Vt tuning dielectric layer includes an interfacial layer and a high-k dielectric layer disposed over the interfacial layer. The gate structure also includes a glue metal layer disposed over the Vt tuning dielectric layer; and a fill metal layer disposed over the glue metal layer. The fill metal layer has a substantially uniform thickness over top surfaces of the plurality of fins.

The semiconductor device of claim 17, wherein the plurality of fins include first and second fins, wherein the Vt tuning dielectric layer includes first and second portions disposed on the first and second fins, respectively, wherein the first portion of the Vt tuning dielectric layer does not contain nitrogen, and wherein the second portion of the Vt tuning dielectric layer contains nitrogen.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a threshold voltage (Vt) tuning dielectric layer over a plurality of fins;
    forming a glue metal layer over the Vt tuning dielectric layer; and
    forming a fill metal layer over the glue metal layer, wherein the fill metal layer has a substantially uniform thickness over top surfaces of the plurality of fins, and wherein the plurality of fins includes first and second fins, and
    wherein the Vt tuning dielectric layer includes first and second portions that cover the first and second fins, respectively, and wherein the forming the Vt tuning dielectric layer comprises incorporating positively charged atoms into the second portion of the Vt tuning dielectric layer for tuning a Vt of the second fin, wherein the first portion of the of the Vt tuning dielectric layer is covered during the incorporating of the positively charged atoms into the second portion of the Vt tuning dielectric layer such that the first portion of the of the Vt tuning dielectric layer is free of the positively charged atoms.

2. The method of claim 1, wherein the incorporating the positively charged atoms into the second portion of the Vt tuning dielectric layer includes performing an anneal process to incorporate nitrogen atoms into the second portion of the Vt tuning dielectric layer.

3. The method of claim 1, wherein the plurality of fins further include a third fin and the Vt tuning dielectric layer further includes a third portion that covers the third fin, and wherein the forming the Vt tuning dielectric layer comprises incorporating lanthanum atoms into the third portion of the Vt tuning dielectric layer for tuning a Vt of the third fin.

4. The method of claim 3, wherein the incorporating the lanthanum atoms includes performing an anneal process.

5. The method of claim 3, wherein the plurality of fins further include a fourth fin and the Vt tuning dielectric layer further includes a fourth portion that covers the fourth fin, and wherein the forming the Vt tuning dielectric layer comprises incorporating both positively charged nitrogen atoms and lanthanum atoms into the fourth portion of the Vt tuning dielectric layer for tuning a Vt of the fourth fin.

6. The method of claim 1, wherein the forming the glue metal layer includes depositing a work function metal material over the Vt tuning dielectric layer.

7. The method of claim 1, wherein the plurality of fins further includes third and fourth fins, and wherein the forming the Vt tuning dielectric layer comprises:
    forming an interfacial layer over the plurality of fins;
    forming a high-k dielectric layer over the interfacial layer;
    forming a cap layer over the high-k dielectric layer;
    removing portions of the cap layer to expose portions of the high-k dielectric layer disposed over the second and fourth fins without exposing portions of the high-k dielectric layer disposed over the first and third fins;
    driving nitrogen atoms into the exposed portions of the high-k dielectric layer; and
    removing remaining portions of the cap layer.

8. The method of claim 7, wherein the forming the Vt tuning dielectric layer further comprises:
    forming a lanthanum oxide layer over the high-k dielectric layer;
    removing the lanthanum oxide layer disposed over the first and second fins;
    performing an anneal process on the lanthanum oxide layer disposed over the third and fourth fins, wherein the anneal process drives lanthanum atoms from the lanthanum oxide layer into the high-k dielectric layer disposed over the third and fourth fins; and
    after performing the annealing process, removing the lanthanum oxide layer disposed over the third and fourth fins.

9. A method of fabricating an integrated circuit (IC) structure, comprising:
    providing a device structure that includes:
        a substrate, and
        first, second, third, and fourth fins disposed over the substrate and extending in a first direction;

forming an interfacial layer over the first, second, third, and fourth fins;
forming a high-k dielectric layer over the interfacial layer;
forming a cap layer over the high-k dielectric layer;
selectively removing the cap layer to expose portions of the high-k dielectric layer that are over the second and fourth fins;
driving positively charged atoms into the exposed portions of the high-k dielectric layer to shift a threshold voltage (Vt) of the second fin and a Vt of the fourth fin; and
removing remaining portions of the cap layer.

10. The method of claim 9, further comprising:
forming a lanthanum oxide layer on the high-k dielectric layer;
patterning the lanthanum oxide layer to remove the lanthanum oxide layer over the first and second fins; and
driving lanthanum from the lanthanum oxide layer over the third and fourth fins into the high-k dielectric layer over the third and fourth fins to shift a Vt of the third fin and to further shift the Vt of the fourth fin.

11. The method of claim 10, wherein the driving the lanthanum includes performing an anneal process.

12. The method of claim 10, wherein the patterning the lanthanum oxide layer comprises:
forming a hard mask (HM) layer over the lanthanum oxide layer;
removing the HM layer over the first and second fins;
removing the lanthanum oxide layer over the first and second fins; and
removing the HM layer to expose the lanthanum oxide layer over the third and fourth fins.

13. The method of claim 9, further comprising:
forming a glue metal layer over the high-k dielectric layer, wherein the glue metal layer is formed using a material configured to serve as a work function metal of the first fin; and
forming a fill metal layer over the glue metal layer.

14. The method of claim 9, wherein the driving the positively charged atoms includes driving in nitrogen atoms by an anneal process or a plasma treatment process.

15. A semiconductor device, comprising:
a semiconductor substrate;
a plurality of fins disposed over the semiconductor substrate; and
a gate structure disposed across the plurality of fins, the gate structure comprising:
a threshold voltage (Vt) tuning dielectric layer disposed over the plurality of fins and configured to contribute to a different Vt for each of the plurality of fins, wherein the Vt tuning dielectric layer comprises an interfacial layer and a high-k dielectric layer disposed over the interfacial layer, wherein the plurality of fins includes first and second fins, wherein the Vt tuning dielectric layer includes first and second portions disposed on the first and second fins, respectively, wherein the first portion of the Vt tuning dielectric layer does not contain nitrogen, and wherein the second portion of the Vt tuning dielectric layer contains nitrogen;
a glue metal layer disposed over the Vt tuning dielectric layer; and
a fill metal layer disposed over the glue metal layer, wherein the fill metal layer has a substantially uniform thickness over top surfaces of the plurality of fins.

16. The semiconductor device of claim 15, wherein the plurality of fins further includes third and fourth fins, wherein the Vt tuning dielectric layer further includes third and fourth portions disposed on the third and fourth fins, respectively, wherein the third portion of the Vt tuning dielectric layer contains lanthanum, and wherein the fourth portion of the Vt tuning dielectric layer contains nitrogen and lanthanum.

17. The semiconductor device of claim 16, wherein the first portion of the Vt tuning dielectric layer is free of lanthanum.

18. The semiconductor device of claim 16, wherein the second portion of the Vt tuning dielectric layer is free of lanthanum.

19. The semiconductor device of claim 16, further comprising a fill material disposed over the first, second, third and fourth fins.

20. The semiconductor device of claim 15, wherein the glue metal layer is in direct contact with the high-k dielectric layer and the fill metal layer is in direct contact with the glue metal layer.

* * * * *